US012362136B2

(12) United States Patent
Savas (10) Patent No.: US 12,362,136 B2
(45) Date of Patent: Jul. 15, 2025

(54) APPARATUS AND METHOD FOR MEASURING PEDESTAL VOLTAGE UNIFORMITY IN PLASMA PROCESSING CHAMBERS

(71) Applicant: Stephen Savas, Pleasanton, CA (US)

(72) Inventor: Stephen Savas, Pleasanton, CA (US)

( * ) Notice: Subject to any disclaimer, the term of this patent is extended or adjusted under 35 U.S.C. 154(b) by 30 days.

(21) Appl. No.: 18/124,586

(22) Filed: Mar. 22, 2023

(65) Prior Publication Data
US 2023/0386780 A1    Nov. 30, 2023

Related U.S. Application Data

(60) Provisional application No. 63/322,232, filed on Mar. 22, 2022.

(51) Int. Cl.
*H01J 37/244*    (2006.01)
*H01J 37/32*    (2006.01)

(52) U.S. Cl.
CPC ....... *H01J 37/244* (2013.01); *H01J 37/32091* (2013.01); *H01J 2237/24564* (2013.01); *H01J 2237/3323* (2013.01); *H01J 2237/3343* (2013.01)

(58) Field of Classification Search
CPC ........... H01J 37/244; H01J 2237/24564; H01J 2233/3323; H01J 2237/3343; G01R 19/0061; G01R 27/2605
See application file for complete search history.

(56) References Cited

U.S. PATENT DOCUMENTS

| 8,697,197 | B2 * | 4/2014 | Savas | H01J 37/32449 |
| | | | | 427/579 |
| 11,605,527 | B2 * | 3/2023 | De Chambrier | H01J 37/32183 |
| 2006/0045667 | A1 * | 3/2006 | Savas | H01L 21/67236 |
| | | | | 414/217 |

* cited by examiner

Primary Examiner — Reena Aurora
(74) Attorney, Agent, or Firm — Stephen E. Zweig (57) ABSTRACT

The apparatus and method herein discloses a voltage measurement device that mounts onto a pedestal, or on a wafer or electrostatic chuck on the pedestal of an RF plasma processing device while open to the air. Then RE power is provided to the pedestal and the apparatus measures the RF voltage distribution at the surface upon which it is mounted, providing information on the uniformity, while mimicking the resistive and reactive impedance of a processing plasma in that chamber. The device comprises a conducting top plate supported at a controlled distance from the wafer or pedestal surface and parallel to it. It has capacitive sensors that touch and pick-up the voltage on the surface upon which it is mounted, resistive elements that pick-up RE current from the exposed top surface, mimicking the resistance of the plasma and dissipating RE power and further a controlled capacitance per unit area between the surface upon which it rests and the conducting top plate mimicking the sheath capacitance of the process plasma.

20 Claims, 3 Drawing Sheets

APPARATUS AND METHOD FOR MEASURING PEDESTAL VOLTAGE UNIFORMITY IN PLASMA PROCESSING CHAMBERS

PROBLEMS OF THE PRIOR ART AND HOW THE INVENTION HELPS SOLVE THEM

The etching or deposition rate in capacitive coupled plasma-based processing chambers usually varies by several percent or more across silicon wafers and often more over the larger area rectangular substrates. In both these cases this is more than specifications allow for high yields in manufacturing electronic products. Such silicon wafers or polymer/metal composite or glass and may be used for devices including semiconductor integrated circuits, solar panels, packaging substrates for integrated circuit chips, visual displays, and many other electronic products. A large part of this non-uniformity in etching rate (or deposited film properties for plasma CVD) is due to non-uniformity of the voltage on the substrate support pedestal or substrate surface, which is reflected in etching results on the substrate. In the case of semiconductor wafer processing this voltage non-uniformity may in part be due to small variations in the assembly of the components of the RF power feed circuit, the wafer support pedestal, or even the chamber enclosure. Further, the variations may be due to minute variations in electrostatic chucks (E-Chucks) which are often positioned between the support pedestal and the wafer, and have conducting structures that unevenly transmit the RF power from pedestal to the wafer.

Because etching rates for sputtering or ion-activated surface etching (RIE) often depend on energies of bombarding ions, and therefore on the voltage on the wafer or substrate surface, the non-uniformity of these etching rates therefore depend on the variations over the surface of the RF voltage on the pedestal or structure supporting the wafer or substrate. Such non-uniformity of surface voltage is due in part to standing wave interference effects for RF (electromagnetic) surface current propagation across the substrate in the presence of plasma. Effectively, the pedestal is like a planar transmission line with plasma loading, that may have many directions of wave propagation across the surface.

Following manufacture of such an etching chamber or following maintenance of the chamber there are usually deviations of the uniformity of the process from that in other chambers of the same type and even variations from the same chamber prior to the maintenance. Typical methods for optimizing the uniformity of etching processes in these cases involve etching (or depositing in the case of plasma CVD) test substrates for a range of hardware configurations and processing conditions. Such optimization is almost always very expensive for new plasma chamber configurations or applications since substrates are costly, tests are time consuming and there is a very large parameter space for process tests. Further, spatially dependent gas chemistry effects are important in determining etching rate variations across substrate or wafer and can complicate understanding the cause of variations and therefore make optimization of uniformity more difficult. The apparatus disclosed herein—a multi-point RF voltage capacitively coupled measurement device that simulates the RF impedance of an actual process plasma—enables very fast, accurate and inexpensive measurement of substrate RF voltage non-uniformity (i.e. variation across its surface). This enables rapid assessment of effects of pedestal components and configurations on etching (or plasma CVD film properties) uniformity. Methods for optimization of etching rate uniformity using the disclosed apparatus are also disclosed herein.

SUMMARY OF THE INVENTION

The disclosed plasma simulation and RF voltage measuring device operates with no plasma present, typically with the chamber open to the air. It has at least one planar plate or sheet, including a first, top plate that is conducting material such as metal, and in some embodiments may also include other plates that may comprise dielectric and conducting material(s) that may be positioned below the metal plate between it and the surface whose voltage is to be measured. The top conducting plate may be made from any non-magnetic conducting material such as aluminum, copper, graphite or a slightly conducting material such as graphite or silicon. A lower plate may be dielectric such as ceramic, quartz, or plastic(s), or weakly electrically conducting material, and have largely uniform thickness. In some embodiments all plates may be approximately the same lateral size or larger than the substrate or pedestal, and the top conducting plate may be the same lateral size or larger than the substrate, wafer or pedestal. In multi-plate embodiments all plates may be aligned vertically one on top of another, being largely parallel with one another. The conducting top plate should be very accurately parallel with the surface whose voltage is to be measured so as to avoid uneven capacitance/area from that surface to the top plate.

In some embodiments there are two or more plates in the apparatus, of which the first, top metal or conducting plate is always present. One or more capacitive probes may be positioned within the device, such that each picks up the surface voltage on the wafer, substrate or pedestal at a location on its surface. Such probe may be integrated into this structure with a lower part that contacts the surface whose voltage is to be measured, a middle part that may be a pin or shaft that brings the signal from that lower part to an upper part, a feed-through embedded into the first conducting plate on the top. There may in some embodiments be a 50 Ohm termination at the feedthrough. There may in some embodiments be a diode rectifier at or proximate the feed-through to convert the RF voltage to a dc voltage which can more easily be converted to a digital signal. A two-plate embodiment may have a first, topmost plate of metal positioned parallel to and at some precise distance above the surface to be measured while a second plate whose thickness is precisely chosen such as to provide a desired capacitance per unit area is positioned between the surface to be measured and the first plate. In some embodiments every plate has approximately the same shape for a given pedestal—rectangular or round—with each plate's thickness being between about 0.5 mm and about 30 mm. When the disclosed apparatus is mounted on the pedestal or substrate to make measurements, it covers approximately the entire pedestal or substrate surface, and in some embodiments the plates may be larger and extend beyond the edge of substrate or pedestal. In some embodiments the first plate serves as a ground plane and may be electrically grounded, by conducting straps or metal structures, to the processing chamber body. If there are more than two plates, everyone but the topmost plate may be dielectric. In some embodiments the dielectric plates may be held in the structure with edge(s) aligned with the top metal grounded plate above. In some embodiments the dielectric plate(s) and/or the metal plate may extend beyond the edge(s) of the pedestal or substrate. In some embodiments the plates may be held together by dielectric standoffs or other fixtures, and in some embodiments there may be a gap between any pair of plates.

When the apparatus is mounted onto the pedestal or substrate, the dielectric plates(s) are between the grounded metal plates and the pedestal. In some embodiments the distance from the grounded metal plate to the substrate or pedestal below is uniform over the surface area of the pedestal to within 0.2 mm or less. In some embodiments the distance may be uniform to within 0.1 mm or less. In some embodiments the gap between the top conducting plate and the surface to be measured may be constant to less than about 1c/o. If there is a gap between first, metal plate, and the second plate or any pair of plates, this gap should be approximately uniform in width, ideally within about 2 mm or less, across the entire area. A gap between any pair of plates may vary in size from 0.0 mm to about 10 mm and may be uniform in size to within about 1 mm and preferably less than 0.5 mm. This assembly consisting of one or more plates may be positioned for measurements by placing it directly upon the pedestal, or upon an electrostatic chuck that is mounted on the pedestal or upon a substrate or wafer that has been mounted on the pedestal or upon an electrostatic chuck on the pedestal.

Resistive elements may be positioned to pass through the hole(s) in the one or more dielectric plates spanning the distance between the surface to be measured and the top plate. The resistive elements in some embodiments consist of a resistive part that comprises the larger part of the length of the resistive element, and a dielectric part that is not thicker than about 10 mm that are bonded together, the resistive part comprising the greater length of the two parts. The dielectric part may be positioned in contact with the surface to be measured and have a slightly greater cross section area or footprint than the resistive part that is tightly held in the top plate. There are holes for said elements in both top conducting plate and dielectric plate(s) that may be approximately aligned vertically with one another. Resistive elements may fit tightly or be clamped into holes in the top plate so as to be able to efficiently conduct heat generated by current flow in the resistive element into the top plate. The top plate may be provided with cooling using flowing air such as by fans and may use heat sinks with fins on its top side to improve heat removal. This permits substantial amounts of electrical power to be dissipated in the resistive elements by the RF currents from the pedestal and yet avoid overheating of the elements or the top plate. The power dissipated in the resistive elements may be approximately equal to the amount of power that would be dissipated in the plasma load when operating at the same voltage on the surface being measured. This power may be as much as 5 kWatts for a 300 mm diameter wafer or 2 kWatts for a 200 mm wafer.

In some embodiments sensors or leads for sensors may penetrate some of the holes that are in the plates, and in some embodiments these holes may be aligned vertically for all plates in a device or for a subset of these holes. Further, electrical leads or pins may first pass through an insulator piece that is placed in a hole in the top plate, and may extend through a dielectric plate, if present, that may be below the metal plate. In some embodiments the sensor or probe tip may not touch the substrate or pedestal and may hit the bottom of a hole that only partially penetrates a dielectric plate. In some embodiments having two or more plates, the hole in the dielectric plate closest to the pedestal may have a hole that does not completely pass through so the hole is blind and ends within the plate. In this case the probe or sensor capacitively couples to the substrate or pedestal through the remaining dielectric thickness in the plate closest to the pedestal.

In some embodiments some holes in the metal plate may have RF electrical connectors mounted on them instead of insulator and pin as described above, and a signal-carrying pin of the connector may, in embodiments having a dielectric plate, extend down into a hole in the dielectric where it connects, in some embodiments through a small connector, with the lead of a capacitive probe or sensor for measuring surface voltage. In some embodiments an insulator plug may be mounted upon and/or into holes in the metal plate, and a conducting pin extend through this insulator and may engage and connect with the lead of a capacitive probe as shown in FIG. 3.

Figure 3:
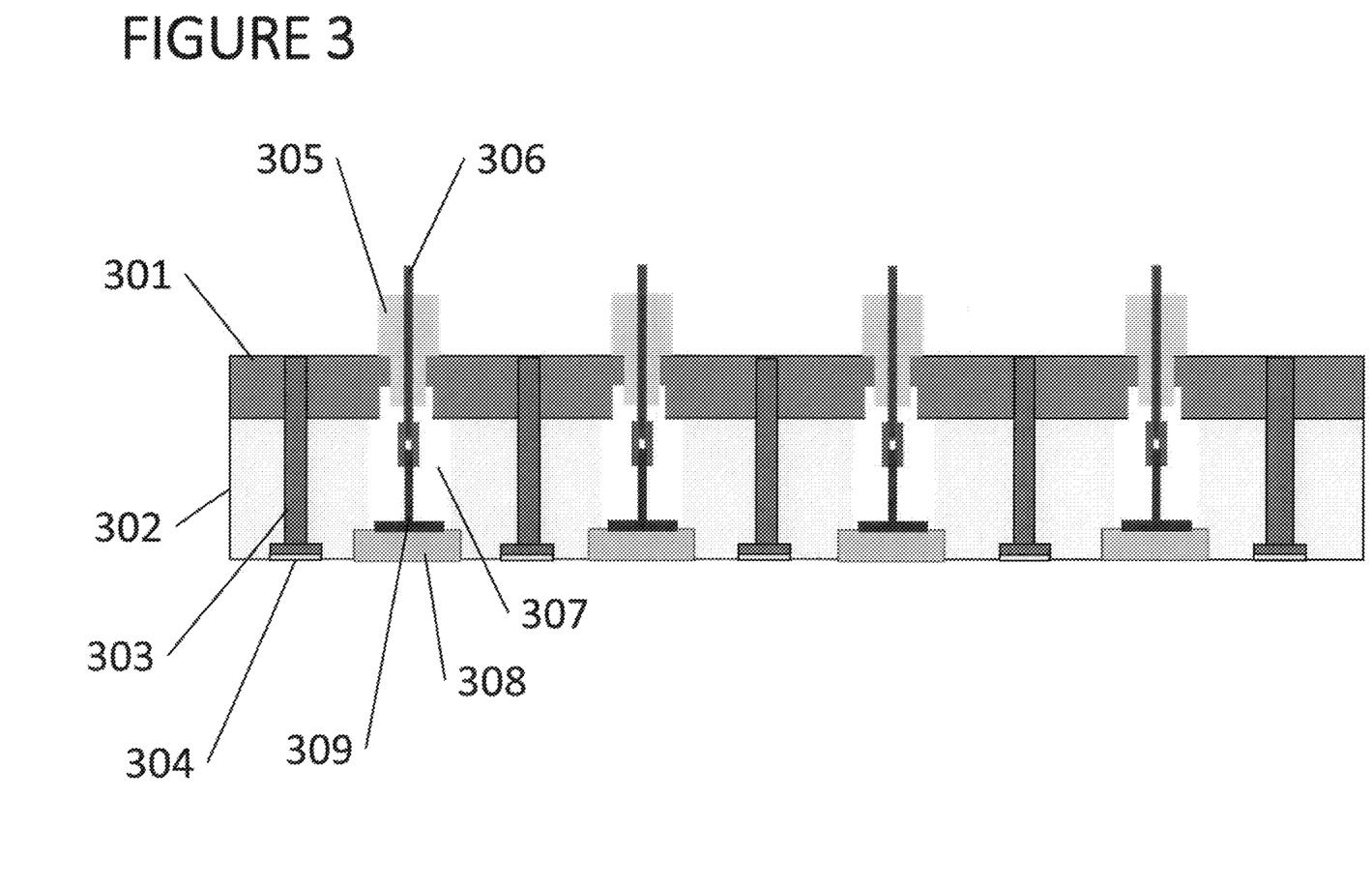
FIG. 3 shows a cross section view of the voltage measurement device in an example embodiment having two plates, including a top metal plate, 301, of thickness between about 1 mm and about 15 mm, that is aligned with and fixed to a dielectric plate, 302, that may be either ceramic, quartz or plastic of thickness between 1 mm and 30 mm

In some embodiments only a subset of the holes through grounded metal plate and dielectric plate(s), if present, may be filled with sensors or probes, while another subset of holes may be filled with resistive elements or plugs as shown in FIG. 3. In some embodiments the resistive elements may be plugs that are made of one or more of the materials: silicon, silicon carbide, graphite or other highly resistive material. Said plugs may have a diameter that may be less than the diameter of the holes and may be electrically connected at the top to the grounded metal plate. Such plugs may have contact surfaces on their bottoms that make contact with the pedestal surface. In some embodiments the plugs may have metal tips on their bottoms. In some embodiments the plugs may have larger diameters on their bottom ends than the top part of the plugs, so that the plugs may make greater capacitive contact with the pedestal through a substrate or dielectric layer on the bottom. Such resistive plugs may have electrical resistance from their top to their bottom in the range between about 200 Ohms to about 5000 Ohms. There may be between about 4 such plugs to as many as 100 plugs embedded into the multi-plate device. The plugs should generally be distributed approximately evenly over the surface area of the device. See FIG. 3 for a cross section view of the RF voltage measurement device.

For some embodiments where there are one or more dielectric plates, they may be chosen to have dielectric constant(s) appropriate to the plasma condition being simulated which means that the wavelength of the RF current on the surface of the pedestal has approximately equal wavelength as in the desired process plasma. In some embodiments there may be one or more dielectric plates whose dielectric constants may be chosen to best simulate EM characteristics of a low-density plasma with a thick sheath which is appropriate for very low-pressure sputter etch processes. The one or more dielectric plates may be quartz, silicon nitride or even plastics such as polycarbonate or Teflon or Peek—all of which have a dielectric constant of approximately 2 to 6. For RIE chambers, especially those with high density plasma, some of which may typically operate at higher pressures such as 20 mTorr and above, the appropriate dielectric(s) may be aluminum oxide or other ceramic such as aluminum nitride or other metallic oxides or nitrides, such that the dielectric constant(s) are in the range between approximately 5 and 25. The purpose of the dielectric material is two-fold: First, to make the capacitance per unit area to ground when using the disclosed device approximately equal to the capacitance across the plasma sheath when performing the etching or CVD process. Second, to make the wavelength of RF currents and EM surface waves propagating on the surface of the pedestal or substrate when using the disclosed device approximately equal to wavelengths of RF current flow (and EM surface waves) on the pedestal or substrate in the presence of plasmas for etching (or plasma CVD) in the same chamber. Plasmas typically cause the wavelength of RF currents and EM waves propagating on the surface of the pedestal or substrate to shorten by a factor roughly equal to the square root of the ratio of the plasma skin depth to the thickness of the plasma sheath adjacent the pedestal or substrate. Wavelengths for RF current on strip-line dielectric-filled transmission lines is less than that for vacuum transmission lines by a factor of the square root of the dielectric constant of the filler material.

When processing with less dense plasmas at lower gas pressures there are typically larger plasma sheaths adjacent the pedestal and modestly larger skin depth so that the ratio of electromagnetic skin depth to boundary layer (sheath) is approximately between about 2 and about 8 resulting in a wavelength reduction of about 2 to 3. On the other hand, when pressures are higher and plasma density higher the plasma sheath is substantially thinner and electromagnetic plasma skin depth in the plasma is only slightly thinner so that the ratio of plasma skin depth to sheath thickness may be in the range between about 5 and about 25 and the wavelength reduction by a factor of about 2 (for high voltage sheaths with very dense plasmas) to 5 (for lower voltage sheaths with lower density plasmas).

The disclosed apparatus mounts over an RF biased pedestal in a plasma processing chamber to measure the RF voltage upon an exposed top surface above the pedestal while simultaneously mimicking the complex impedance of a process plasma at such exposed surface. An electrically conducting top plate of said apparatus is physically supported above the exposed surface and held parallel to it by a plurality of supports that may in some embodiments also be resistive elements, wherein the capacitance per unit area between the exposed surface and the conducting top plate is less than about 1 picofarad per square centimeter. Said resistive elements, each having largely resistive impedance at an RF operating frequency of the plasma processing chamber, are in electrical contact with the top plate, and physically contact the exposed top surface to be measured that may be the surface of the wafer or electrostatic chuck or bare pedestal. A resistive element may comprise one part that is electrically resistive material, and a second part of insulating material. the insulating part has a width that is greater than a thickness dimension and the thickness dimension is less than about 3 mm. There may be at least 6 resistive elements for a 200 mm wafer size pedestal and at least 12 for a 300 mm wafer size pedestal.

At least one capacitively coupled voltage sensor is configured to be in contact with the exposed surface to be measured, and connect to a lead that passes through the conducting top plate to convey an electrical signal to a device that measures the RF voltage of said signal. There may be a plurality of such voltage sensors to measure surface voltage at a number of points to determine the uniformity of the voltage on the surface being measured. A capacitively coupled voltage sensor comprises an insulating part at the bottom that may be shorter than about 5 mm and a conducting part above the insulating part that connects electrically to a lead. The resistive part may have a resistance that is greater than about 100 Ohms. That lead in turn may connect to a feedthrough or pass through an insulator that fills the hole in the plate. In some embodiments a lead from the sensor connects to a feedthrough and the feedthrough has a 50 Ohm termination to ground. In some embodiments the lead from a sensor connects to a rectifier circuit so that the signal from the sensor produces a dc output voltage. In some embodiments the magnitude of the reactive impedance of the sensor to the exposed surface is greater than about 1000 Ohms.

BRIEF DESCRIPTION OF THE DRAWINGS

Referring to FIG. 2a: The probe lead or pin, 201, connects to a tip, 202, that is a pickup for the electrical signal coming from the substrate or pedestal.

DETAILED DESCRIPTION OF AN EMBODIMENT OF THE INVENTION

The disclosed invention facilitates rapid improvement or tuning and greatly reduces cost in improving uniformity of etching or CVD processes on large rectangular or round (such as silicon wafers) substrates by enabling real-time monitoring of the uniformity of surface voltage under impedance conditions approximately equal those when processing with plasma, without actually sustaining a plasma. The measured voltage non-uniformity profile and average value are close to those while operating with plasma because the disclosed invention mimics or simulates the complex impedance of an actual plasma, including RF electrostatic and electromagnetic characteristics.

Figure 1:
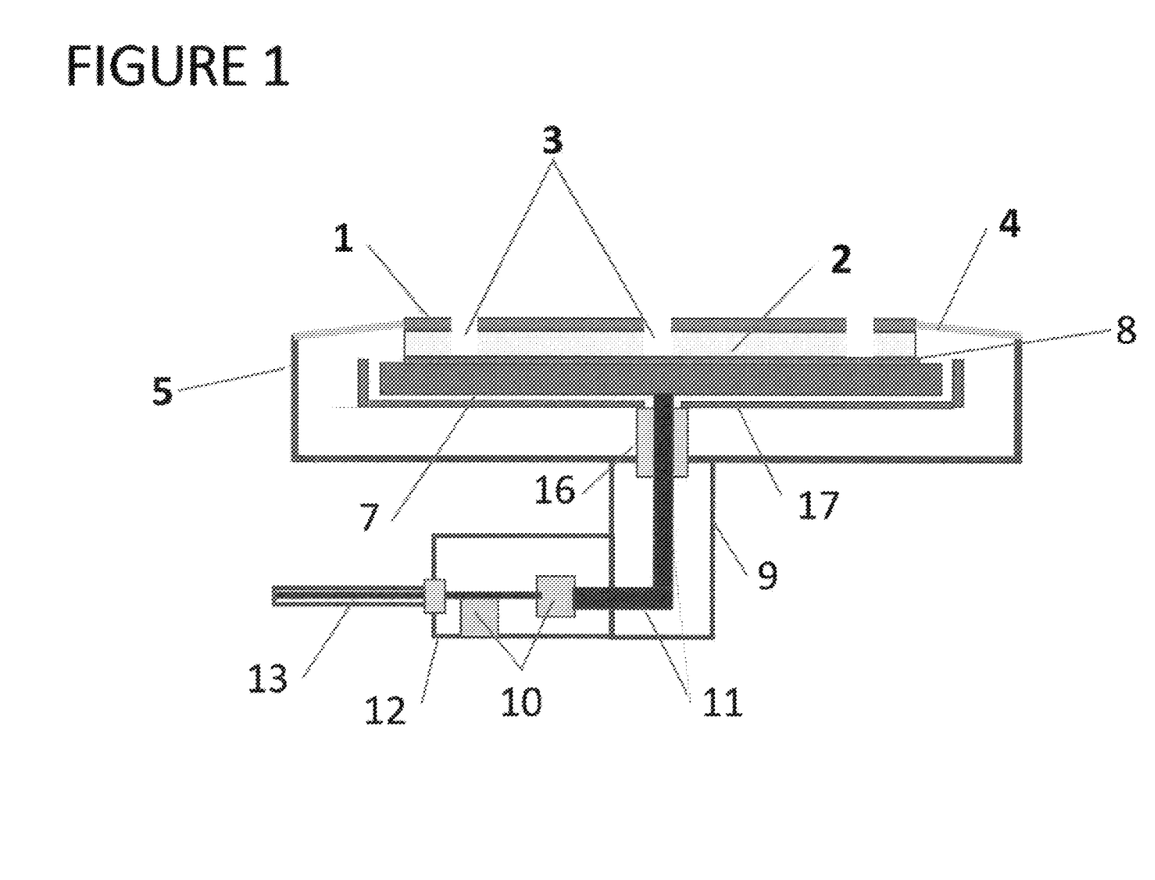
FIG. 1 schematically shows a two-plate embodiment where the first, topmost plate, is of metal, positioned above one dielectric plate.

FIG. 1

A two-plate embodiment is shown schematically in FIG. 1 where the first, topmost plate, is of metal, positioned above one dielectric plate. Showing cross section of an embodiment having two layers, a metal plate with one dielectric plate, FIG. 1 shows positioned in an etching chamber the voltage sensing device we disclose. It consists of a plate or sheet of metal, 1, as the top layer or component directly above a dielectric plate, 2, and substantially fully covering the surface area of substrate, 8, (it may also cover an area approaching that of the pedestal if no substrate is present) because, as shown, a substrate has been loaded onto the pedestal as during processing. A plurality of signal feedthroughs cover holes in the metal sheet 1 and capacitive sensors, 3, (may also be called capacitive probes) are contained within holes in the dielectric plate 2. These sensors pick-up signals from the surface of the substrate or pedestal where no substrate is present. Metal plate 1 comprises the ground plane for the sensors or probes and is in the return current path for the RF currents coming from the pedestal or substrate that are coupled through the disclosed voltage measuring device. There are also resistive plugs, 4, that penetrate through at least the dielectric layer and electrically connect to the ground plane, which have electrical resistance values appropriate to simulate the power dissipation of the plasma. This ground plane is connected by one or more electrically conducting, straps, 5, that may have low electrical inductance, to the side walls of the chamber body, 20, or interior base (not indicated). The grounded metal plate 1 is attached or fixed physically to the dielectric plate 2 which in turn rests on the surface of the substrate 8, as shown, or in some embodiments upon the pedestal directly. The components for supplying RF power to the pedestal are shown below the chamber, including the enclosure, 9, for the RF power providing electric line, 11. Before coming into the enclosure through the electrically conducting line 11 this power flows through an impedance matching network, 12, within which are reactive components, 10. The power is provided to the matching network via a coaxial cable, 13. The power coming through this coaxial cable comes from an RF generator or power supply (not shown) which may be a standard model supplied by one of several established companies. Once the RF power has been impedance matched and RF current is flowing on line 11, it passes through an insulating break, 16, which insulates it from the metal wall of the chamber and may also seal the chamber away from atmosphere so it may be evacuated by vacuum pumps (not shown). The pedestal, 7, is surrounded at least on its bottom by a grounded shield, 17, which is typically made of metal and which does not directly touch the pedestal. The gap between 7 and 17 may be filled with a dielectric such as quartz or other non-conductor material, or in some embodiments simply be empty. In operational state electrical cables connect detectors 3 that are installed into some of the holes 3 so that the voltage at those points on the surface of the pedestal or substrate may be measured accurately. These detectors' outputs are near or above the top surface of the metal ground plane and the electrical cables attached to them are also connected to a Radio Frequency voltage measuring device such as oscilloscope, RF power meter or signal processing instrument.

Figure 2:
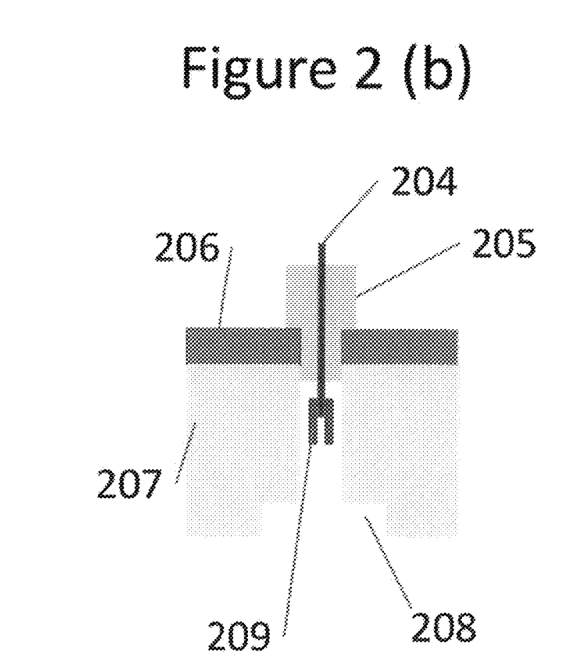
FIG. 2A shows that in some embodiments, capacitive probes or sensors may touch the surface of the substrate or pedestal.
FIG. 2B shows that in some embodiments, the probe lead 201 (in FIG. 2a) plugs or connects directly into a small connector, 209, that may be mounted on the end of the pin or lead 204, that also passes through the insulator, 205, that has been set into the hole in the ground plane, 206.

FIG. 2

Capacitive probes or sensors that may in some embodiments touch the surface of the substrate or pedestal. Referring to FIG. 2a: The probe lead or pin, 201, connects to a tip, 202, that is a pickup for the electrical signal coming from the substrate or pedestal. This lead or pin 201 is made of metal or other electrical conductor material and it connects electrically (directly or capacitively) to a sensor tip, 202, that is made of metal or other electrical conductor. In some embodiments a dielectric disk or piece of other shape than round is adjacent or affixed to the bottom of the sensor tip and may be bonded to the sensor tip. In some embodiments there may not be a dielectric disk bonded to the sensor tip if the substrate itself is a dielectric such as display glass or ceramic so that the substrate itself provides a capacitive element in series from the sensor tip to the pedestal. The dielectric disk may be made of quartz, ceramic, plastic or other insulating material. The range of diameter dimensions of the sensor tip and the dielectric disk are between about 5 mm diameter and about 40 mm diameter. In some embodiments the thickness of the tip may be between about 0.5 mm and 5 mm, and thickness of the dielectric disk may depend on the dielectric constant and dielectric strength of the dielectric disk, and may be in the range between about 0.01 mm and about 5 mm. Having the dielectric disk (or dielectric substrate) 203 between the tip 202 and the pedestal's conducting surface increases the impedance from the sensor tip to the pedestal so that resistive terminations at one or both ends of the signal cable from sensor to voltage measuring instrument may be used. It does reduce the voltage on the sensor tip, but it also avoids DC current conduction between sensor and pedestal which can cause surface damage to the pedestal by micro-arcing. When positioned for measurements, the bottom of this disk 203 may preferably rest flat on the surface of the pedestal 7 in FIG. 1 or the substrate 8 in FIG. 1. For this reason it is desirable that the structure of the connection, 209, or the thickness of the lead 204 allow some flex when pressed against the substrate or pedestal surface to permit surfaces of dielectric disk and pedestal to be touching and flush over virtually the entire surface of the disk. This is essential for measurement accuracy and repeatability.

Referring to FIG. 2b: In some embodiments the probe lead 201 (in FIG. 2a) plugs or connects directly into a small connector, 209, that may be mounted on the end of the pin or lead 204, that also passes through the insulator, 205, that has been set into the hole in the ground plane, 206. In some embodiments this small connector 209 may be within a hole in the insulator layer, 207. In some alternative embodiments, the small connector 209 may be mounted instead onto the conducting pin, or extension thereof, of a bulkhead RF electrical connector (UHF, Type-N, BNC or other standard types—not shown in a FIGURE), which may be mechanically and electrically mounted onto the ground plane 1 (shown in FIG. 1). In some embodiments the probe lead 201 inserts into the small connector 209 and thereby electrically connects the sensor tip 202 to the conducting pin of the bulkhead RF connector or to the pin 204. The pin of the bulkhead connector or pin 204 thus carries signals from the probe tip to external measurement devices for RF voltages. Whether the signal passes through the grounded metal plate via a bulkhead RF connector or a pin through an insulating plug, it carries the signal from the sensor tip. The lead 204 can be connected to a coaxial cable (of a given impedance X—typically a value such as 50 Ohms) whose end at the measurement instrument may be terminated in X Ohms, or end proximate the ground plane may be terminated in X Ohms, so that RF wave reflections are eliminated at either end of coaxial cable and thus give more accurate, repeatable measurements. In order that the dielectric disks are pressed firmly onto the surface of the pedestal or substrate, the dielectric disk in FIG. 2a may wholly or partially fit into the recess, 208, in the dielectric layer so that the bottom of the dielectric disk is flush with or slightly protrudes beyond the bottom of the dielectric layer 207, and whose bottom surface is parallel to the bottom surface of the dielectric plate 207.

FIG. 3

FIG. 3 shows a cross section view of the voltage measurement device in an example embodiment having two plates, including a top metal plate, 301, of thickness between about 1 mm and about 15 mm, that is aligned with and fixed to a dielectric plate, 302, that may be either ceramic, quartz or plastic of thickness between 1 mm and 30 mm. In some embodiments the holes in the two plates have their center axes aligned, though the holes in 301 and 302 may not be the same diameter. Said holes in metal plate 301 in some embodiments may be between about 2 mm and about 15 mm diameter. Holes in the ceramic 302 in some embodiments may be between about 2 mm and about 25 mm. Some holes, including the volumes in the metal and dielectric, are meant to contain the capacitive sensors or probes (whose parts include lead, 306, insulator, 305, sensor tip, 309, and dielectric disk, 308), while other holes are meant to contain resistive slugs, 303, with their insulating end caps, 304.

Resistive slugs 303 that may have a larger area tip, 309, have been inserted into the aligned holes in 301 and 302 and may make direct electrical contact with the metal plate or may make capacitive contact through a dielectric or capacitance. The holes in the dielectric for the slugs may be larger in diameter than the stems of the slugs 303, which are the narrow part of the slugs. The heat generated by RF current flowing in the slugs will generally conduct through the slug to the metal top plate. That top plate may be cooled by air flow or water for applications where the device is operated continuously for periods greater than about 1 minute. The total number of resistive slugs may be between about 4 and about 100. In some embodiments the slugs may number between about 15 and about There may be dielectric covers, 304, or insulating coating (not shown) on the tips of each of the resistive slugs 303 that may be made of ceramic or quartz or tough plastic (such as Peek or vespel, . . . ). Typically, the slugs are between about 3 mm and 15 mm in diameter across the main, narrow part of their length 303 with a wider tip at the bottom that may be between about 2 mm and 30 mm diameter. In some embodiments the tip may be approximately the same diameter as the narrow part of the slug and in some embodiments the tip may be 5 times or more greater than the diameter of the narrow part of the slug. Slugs may be solid rod or hollow tubing made of high resistivity materials. These slugs' material may have resistivity such that the slugs resistance will be in the range between about 500 Ohms and about 50,000 Ohms—a high resistance for a conducting rod of that diameter range. Consequently, the slugs in some embodiments may be solid rod made of silicon carbide or other high resistivity material. Normal graphite has too low a resistivity to work as a solid rod but some types of graphite may be fabricated from tubing so that the resistance of a slug may be in the desired range. In some embodiments amorphous graphite that is small in diameter—less than 5 mm—may be used in solid rod form for slugs under conditions where slug resistance below 1000 Ohms is appropriate. FIG. 3 also shows the capacitive probes (which may be called equivalent term "sensors") that in the embodiment shown, include signal feed-throughs and sensors mounted into the two-layer structure. In the embodiment shown in the FIGURE, the lead to the probe, 306, passes through an insulator, 305, which has been inserted into or upon the top metal plate, 301. There are holes in the dielectric, 307, that may be larger in diameter than the lead 306. In fact, the diameter may be large enough to accommodate the lead with a small connector connecting upper and lower parts of said stem. In fact, in some embodiments the holes for the probes are 3 or more times as large as the stems so that the capacitances of the stem to the top metal sheet and to the pedestal below are lower than they would be for smaller holes that fit more tightly. There is a tip, 309, attached to the lower part of the probe lead and, in some embodiments this may be between about 3 mm diameter and 20 mm diameter. In some embodiments there may be a dielectric disk that may be attached to the tip of the probe or inserted into the dielectric plate 302. Preferably, the tip rests upon or is bonded to the dielectric disk. In some embodiments the feedthrough consists of a bulk-head type RF connector such as are commercially available, including Type-N, Type-HN, Type BNC or other. In this case the pin of the feedthrough is equivalent to pin 306 in the FIGURE, and the insulator around the pin in the feedthrough is equivalent to the insulator plug 305. In this embodiment there may also be a metal casing for the feedthrough that attaches to the metal plate to provide grounding. In this case the connector at one end on an RF cable may connect and attach to the RF feedthrough and then to an RF voltage measurement device such as oscilloscope.

Method of Use of the Disclosed Apparatus for Voltage Measurement and Etching Rate Optimization Since measurements with the disclosed device may be made with the chamber at atmosphere (without plasma), requiring only that the RF power is supplied to the pedestal, installation and measurements can be made very rapidly and cheaply, and in some cases measurements made continuously for different processing conditions. Measurements of surface voltage profile can be made with only brief interruptions for changes to hardware within the processing chamber. Process parameters such as RF power can be varied in real time as measurements are being made. The measurements made characterize surface voltage non-uniformity which correlates with etching rate non-uniformity and may be employed for both sputter etching processes and reactive ion etching processes (RIE) as well as plasma CVD. The method of measurement involves a number of steps:

1. The disclosed voltage diagnostic device should be assembled including the metal plate, and if appropriate to the process condition, one or more dielectric plates. The feedthroughs for signals having been installed in the metal plate, the leads for the probes or sensors should be inserted into the small connector on the pin. If dielectric is present, the lead and connector are within holes in the dielectric. The resistive plugs should also be inserted into designated holes in the metal plate and dielectric plate(s), if present. Measurements of capacitances of each feedthrough and each probe to the metal plate may be made to calibrate the device before installation.

2. The disclosed diagnostic device is then mounted on top of and covering the surface of the substrate or pedestal when the chamber is open and not processing substrates. The device is aligned so that the edge(s) of the dielectric layer are close to and symmetric with respect to the substrate or pedestal.

3. Grounding straps, preferably wide metal straps with low inductance, are electrically connected from the top metal plate to the chamber walls in at least 2 and preferably 4 or more places. In some embodiments there are 4 straps and each is connected to the top metal plate of the disclosed apparatus in the center of each quadrant of the top plate, and the lengths of all straps are the same. In some embodiments the straps may be connected to the edge of the metal plate or other location such as the corners.

4. Coaxial or other electrical cables may be connected in some embodiments to the bulkhead coaxial connectors, or in some embodiments to the pins that carry probe signal through insulating plugs mounted on the metal plate, or to other kinds of electrical leads that will carry signals from probes through metal top plate. In general, the cables should be very nearly equal lengths so that any signal reflection effects are minimized. The other end of such cables may then also be connected to a voltage measurement device such as oscilloscope or RF power meter or other. Such cable connections may be made directly to each of the sensors or probes within the dielectric whose tips touch or rest on a dielectric upon the pedestal or onto the substrate. 50 Ohm or other termination resistors having the proper terminating impedance for the coaxial or other cables, may be connected at either or both ends of each cable—at the measurement device and/or where the electrical connection is made with feedthrough pin at the top plate. These minimize signal reflections at one or both ends of the cables.

5. Once the disclosed device is connected the probes or sensors may be calibrated by measuring the capacitance of each probe or sensor tip to the pedestal. Use of a capacitance meter is one alternative, but the capacitance of the signal line to the ground shield of the coaxial cable or to a return line of a twisted pair cable or other cable may be subtracted out of the measured capacitance value with the cable connected to the probe lead to yield the actual sensor capacitance to the pedestal. These capacitances should be very nearly equal for all the probes. RF power to the pedestal is turned on and RF voltages on one or more of the sensors are measured (by oscilloscope or by RF power-meter or RF voltmeter). The device may be operated while the chamber is at atmosphere pressure (not in vacuum) while RF power is provided to the pedestal in the normal manner as if processing a substrate. Plasma will not be present, but with the disclosed device installed, the RF impedance characteristics of the disclosed device should closely match the impedance of an actual specific process plasma, so that the RF currents and measured voltages at sensors across the pedestal or substrate surface are close to what they would be in a real process at that RF power level.

6. Once the RF voltage profile across the substrate is measured, this profile should be matched in a table with etching rate variations across a substrate of an actual process. Once this is done for several process conditions, spanning a range of RF power and gas conditions, this may serve as a calibration of the correlation between voltage variation and etching rate variation. In general, RF power input for the etching process should be the same as for the voltage measurement. It may be appropriate to change the dielectric or add an additional dielectric plate as pressure conditions change and to a much lesser extent as power conditions change. A further comparison should be made, at any given power level where calibration is done, between the matching network's reported load impedance for voltage measurement and load impedance for etching rate tests. If these are very different then adjustment of the dielectric or gap from top metal plate to dielectric should be made until the imaginary part of the plasma impedance is within about 30% or less of the imaginary part of the impedance with the voltage measurement apparatus. Further, if the real part of the load impedance for the disclosed voltage measurement device differs substantially (>30%) from that measured for a real process then the resistance of the resistive shunts should be adjusted until real part of load impedance matches that with plasma within 30% or less. By the calibration method in 6, above, the correlation between etching rate non-uniformity and voltage non-uniformity is quantified so that future measurements of non-uniformity of voltage profile can be used to estimate the approximate etching rate non-uniformity.

The invention claimed is:

1. An apparatus for measuring RF voltage at an exposed pedestal surface of a plasma processing chamber configured to operate at an RF operating frequency, said apparatus comprising:
an electrically conducting top plate physically supported above said exposed pedestal surface;
said electrically conducting top plate electrically connected to a ground,
wherein said electrically conducting top plate is physically supported above said surface, and is configured parallel to said surface, by a plurality of supports;
a plurality of resistive elements, each having resistive impedance at said RF operating frequency of said plasma processing chamber, are configured in electrical contact with said top plate, and physically contact said exposed pedestal surface;
at least one capacitively coupled voltage sensor, positioned below said electrically conducting top plate is configured to be in contact with said exposed pedestal surface and connect to a lead that passes through said conducting top plate;
said at least one capacitively coupled voltage sensor configured to convey an electrical signal to an RF measuring device that measures said RF voltage.

2. An apparatus as in claim 1, wherein said apparatus further comprises a plurality of said voltage sensors.

3. An apparatus as in claim 1, wherein said resistive elements further comprise physical supports for said top plate.

4. An apparatus as in claim 1, wherein a dielectric plate is further positioned parallel to and below said top plate.

5. An apparatus as in claim 4 wherein said resistive elements and said leads from said voltage sensors pass through said dielectric plate and then to said top plate.

6. An apparatus as in claim 4 wherein the capacitance per unit area between said exposed pedestal surface and said conducting top plate is less than 1 picofarad per square centimeter.

7. An apparatus as in claim 1, wherein said resistive element further comprises part electrically resistive material, and part insulating material.

8. An apparatus as in claim 1, wherein said capacitively coupled voltage sensor comprises an insulating part at its bottom and a conducting part above the insulating part that connects electrically to said lead.

9. An apparatus as in claim 8, wherein said insulating part has a width that is greater than a thickness dimension and said thickness dimension is less than about 3 mm.

10. An apparatus as in claim 8, wherein said insulating part of said voltage sensor is configured to touch said surface of said pedestal below said top plate.

11. An apparatus as in claim 1, wherein said resistive elements consist of a resistive part and an insulating part where said resistive part has a resistance greater than about 1000 ohms.

12. An apparatus as in claim 8 wherein said resistive element has an electrical resistance between 500 Ohms and 50,000 Ohms.

13. An apparatus as in claim 1, wherein said plurality of resistive elements comprises at least 6 resistive elements and wherein said at least one capacitively coupled voltage sensor comprises at least 6 sensors.

14. An apparatus as in claim 1, wherein a at least one said lead from said at least one voltage sensor connects to a feedthrough and said feedthrough has a 50 Ohm termination to ground.

15. An apparatus as in claim 1 wherein at least one said lead from said at least one voltage sensor connects to a rectifier circuit so that the signal from said at least one voltage sensor produces a dc output voltage.

16. An apparatus as in claim 1 wherein a reactive impedance at said RF operating frequency of said at least one voltage sensor to said exposed pedestal surface is greater than 1000 Ohms.

17. The apparatus as in claim 1 wherein at least one said resistive element fits tightly into a hole in said top plate, thus enabling efficient conductive heat transfer from at least one said resistive element to the said plate.

18. An apparatus as in claim 1 wherein at least one said lead passes through a dielectric plug that fills a hole in said top plate.

19. An apparatus as in claim 1 wherein said at least one capacitively coupled voltage sensor further comprises a dielectric piece that is bonded to a conducting sensor tip;

said sensor tip is configured to be in contact with said exposed pedestal surface; and
wherein said sensor tip has a diameter between about 3 mm and 20 mm.

20. An apparatus as in claim 1, wherein at said RF operating frequency, said apparatus is configured to mimic the impedance of a substrate process plasma during substrate processing.

* * * * *